United States Patent [19]
Gardner et al.

[11] Patent Number: 5,874,341
[45] Date of Patent: Feb. 23, 1999

[54] METHOD OF FORMING TRENCH TRANSISTOR WITH SOURCE CONTACT IN TRENCH

[75] Inventors: Mark I. Gardner, Cedar Creek; Daniel Kadosh; Frederick N. Hause, both of Austin, all of Tex.

[73] Assignee: Advanced Micro Devices, Inc., Sunnyvale, Calif.

[21] Appl. No.: 739,567

[22] Filed: Oct. 30, 1996

[51] Int. Cl.$^6$ .................................................. H01L 21/336
[52] U.S. Cl. ............................................ 438/301; 438/589
[58] Field of Search ................................... 438/133, 197, 438/246, 247, 589, 301

[56] References Cited

U.S. PATENT DOCUMENTS

| | | | |
|---|---|---|---|
| 4,745,086 | 5/1988 | Parillo et al. | 437/57 |
| 4,830,975 | 5/1989 | Bovaird et al. | 437/41 |
| 5,094,973 | 3/1992 | Pang | 437/67 |
| 5,141,891 | 8/1992 | Arima et al. | 437/44 |
| 5,166,084 | 11/1992 | Pfiester | 437/40 |
| 5,175,118 | 12/1992 | Yoneda | 437/40 |
| 5,231,038 | 7/1993 | Yamaguchi et al. | 437/40 |
| 5,362,662 | 11/1994 | Ando et al. | 438/301 |
| 5,451,804 | 9/1995 | Lur et al. | 257/330 |
| 5,504,031 | 4/1996 | Hsu et al. | 437/57 |
| 5,512,506 | 4/1996 | Chang et al. | 437/44 |
| 5,538,913 | 7/1996 | Hong | 437/44 |
| 5,545,579 | 8/1996 | Liang et al. | 437/44 |
| 5,547,884 | 8/1996 | Yamaguchi et al. | 438/301 |
| 5,554,550 | 9/1996 | Yang | 437/43 |
| 5,567,635 | 10/1996 | Acovic et al. | 437/43 |
| 5,571,738 | 11/1996 | Krivokapic | 437/44 |
| 5,574,302 | 11/1996 | Wen et al. | 257/330 |
| 5,587,331 | 12/1996 | Jun | 438/301 |
| 5,610,091 | 3/1997 | Cho | 437/43 |
| 5,640,034 | 6/1997 | Malhi | 257/341 |

FOREIGN PATENT DOCUMENTS

| | | |
|---|---|---|
| 64-4058 | 1/1989 | Japan . |
| 2-22868 | 1/1990 | Japan . |

*Primary Examiner*—John Niebling
*Assistant Examiner*—Michael S. Lebentritt
*Attorney, Agent, or Firm*—Skjerven, Morrill, MacPherson, Franklin & Friel LLP; David M. Sigmond

[57] ABSTRACT

An IGFET with a gate electrode and a source contact in a trench is disclosed. The IGFET includes a trench with opposing sidewalls and a bottom surface in a semiconductor substrate, a gate insulator on the bottom surface, a gate electrode on the gate insulator, a source contact on the bottom surface, insulative spacers between the gate electrode, the source contact and the sidewalls, and a source and drain adjacent to the bottom surface. A method of forming an IGFET includes forming a trench with first and second opposing sidewalls and a bottom surface in a substrate, forming disposable spacers on the bottom surface, forming a gate insulator material on the bottom surface between the disposable spacers, depositing a gate electrode material on the gate insulator material and disposable spacers, polishing the gate electrode material and then anisotropically etching a lateral portion of the gate electrode material and gate insulator material to form the gate electrode and gate insulator, removing the disposable spacers, forming a first insulative spacer adjacent to the first sidewall, a second insulative spacer adjacent to the gate electrode and second sidewall, and a third insulative spacer adjacent to the gate electrode such that a contact portion of the bottom surface between the first and third insulative spacers is exposed, forming a source and drain in the substrate and adjacent to the bottom surface, and forming source and drain contacts such that the source contact is electrically coupled to the source at the contact portion of the bottom surface and the drain contact is electrically coupled to the drain at the top surface of the substrate. Advantageously, the source contact overlaps the trench, thereby improving packing density.

30 Claims, 12 Drawing Sheets

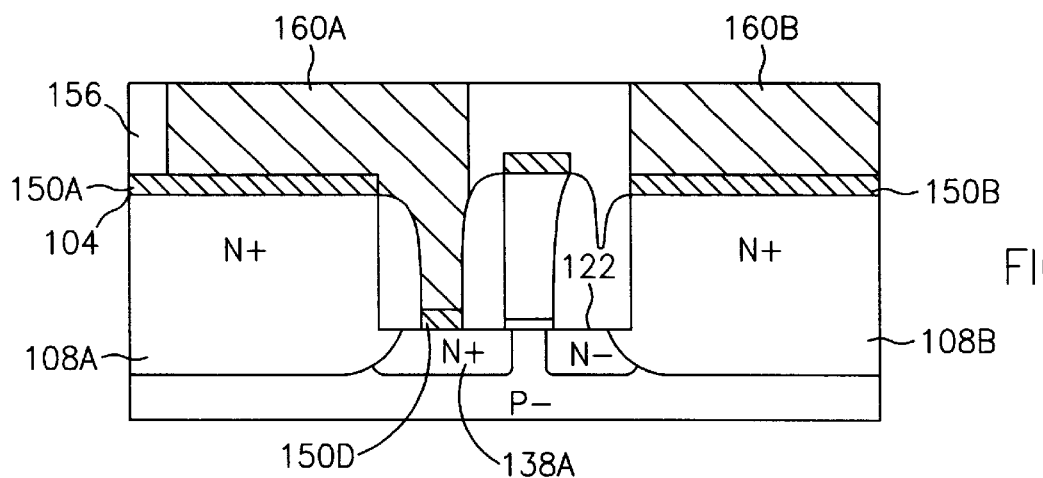

METHOD OF FORMING TRENCH TRANSISTOR WITH SOURCE CONTACT IN TRENCH

BACKGROUND OF THE INVENTION

1. Field of the Invention

The present invention relates to integrated circuits, and more particularly to insulated-gate field-effect transistors.

2. Description of Related Art

An insulated-gate field-effect transistor (IGFET), such as a metal-oxide semiconductor field-effect transistor (MOSFET), uses a gate electrode to control an underlying surface channel joining a source and drain. The channel, source and drain are located in a semiconductor substrate, with the substrate being doped oppositely to the source and drain. The gate electrode is separated from the semiconductor substrate by a thin insulating layer such as a gate oxide. The operation of the IGFET involves application of an input voltage to the gate electrode, which sets up a transverse electric field in the channel in order to modulate the longitudinal conductance of the channel.

In typical IGFET processing, the source and drain are formed by introducing dopants of a second conductivity type (P or N) into the semiconductor substrate of a first conductivity type (N or P) using a patterned gate electrode as a mask. This self-aligning procedure tends to improve packing density and reduce parasitic overlap capacitances between the gate electrode and the source/drain regions.

Polysilicon (also called polycrystalline silicon, poly-Si or poly) thin films have many important uses in IGFET technology. One of the key innovations is the use of heavily doped polysilicon as the gate electrode in place of aluminum. Since polysilicon has the same high melting point as a silicon substrate, it can be deposited prior to source and drain formation, and serve as a mask during introduction of the source and drain regions by ion implantation. The resistance of polysilicon can be further reduced by forming a silicide on its top surface.

There is a relentless trend to miniaturize semiconductor dimensions. The number of IGFETs that can be manufactured on an integrated circuit chip can be increased by decreasing the horizontal dimensions. Resolution refers to the horizontal linewidth or space that a lithographic system can adequately print or resolve. Lithographic systems include optical projection and step and repeat equipment, and electron beam lithography equipment. In optical systems, for instance, resolution is limited by the equipment (e.g., diffraction of light, lens aberrations, mechanical stability), optical properties of the photoresist (e.g., resolution, photosensitivity, index of refraction), and process characteristics (e.g., softbake step, develop step, postbake step, and etching step).

Furthermore, scaling down the horizontal dimensions generally requires a corresponding decrease in the vertical dimensions. As IGFET vertical dimensions are reduced and the supply voltage remains constant (e.g., 3V), the maximum lateral electric field in the channel near the drain tends to increase. If the electric field becomes strong enough, it can give rise to so-called hot carrier effects. For instance, hot electrons can overcome the potential energy barrier between the substrate and the gate insulator thereby causing hot carriers to become injected into the gate insulator. Trapped charge in the gate insulator due to injected hot carriers accumulates over time and can lead to a permanent change in the threshold voltage of the device.

A number of techniques have been utilized to reduce hot carrier effects. One such technique is a lightly doped drain (LDD). The LDD reduces hot carrier effects by reducing the maximum lateral electric field. Reducing the electric field on the order of 30–40% can reduce hot-electron-induced currents by several orders of magnitude. The drain is typically formed by two ion implants. A light implant is self-aligned to the gate electrode, and a heavy implant is self-aligned to the gate electrode on which sidewall spacers have been formed. The spacers are typically oxides or nitrides. The purpose of the lighter first dose is to form a lightly doped region of the drain (or LDD) at the edge near the channel. The second heavier dose forms a low resistivity region of the drain, which is subsequently merged with the lightly doped region. Since the heavily doped region is farther away from the channel than a conventional drain structure, the depth of the heavily doped region can be made somewhat greater without adversely affecting the device characteristics. The lightly doped region is not necessary for the source (unless bidirectional current is used). LDD structures are typically formed for both the source and drain to avoid the need for an additional masking step, however, LDD structures in which the entire source is heavily doped are used in order to reduce parasitic resistance.

In the manufacture of integrated circuits, the planarization of semiconductor wafers is becoming increasingly important as the number of layers used to form integrated circuits increases. For instance, the gate electrode and/or metallization layers formed to provide interconnects between various devices may result in nonuniform surfaces. The surface nonuniformities may interfere with the optical resolution of subsequent lithographic steps, leading to difficulty with printing high resolution patterns. The surface nonuniformities may also interfere with step coverage of subsequently deposited metal layers and possibly cause open circuits.

Accordingly, a need exists for an IGFET that can be manufactured with reduced horizontal dimensions, that preferably includes an LDD with reduced parasitic resistance as well as a substantially planar top surface. It is especially desirable that the IGFET have a channel length that can be significantly smaller than the minimum resolution of the available lithographic system, and that the source and drain contacts be in close proximity to the gate electrode.

SUMMARY OF THE INVENTION

The present invention provides an insulated-gate field-effect transistor (IGFET) with a gate electrode in a trench (i.e., a trench transistor) and a source contact in the trench. A gate insulator and a source contact are disposed on the bottom surface of the trench, and the gate electrode is disposed on the gate insulator. Preferably, localized source and drain regions define a channel beneath the trench that is substantially aligned with the bottom surface of the gate electrode. If the trench length corresponds to the minimum resolution of a lithographic system, then the channel length is significantly smaller than the minimum resolution. Furthermore, the gate electrode is substantially aligned with the top surface of the substrate, substantially all of the gate electrode is within the trench, and the source contact overlaps the trench. In this manner, a highly miniaturized IGFET can be produced.

A key feature of the invention is the formation of the source contact in the trench that is electrically coupled to the source at the bottom surface of the trench.

According to one aspect of the invention, a method of forming an IGFET includes forming a trench with first and second opposing sidewalls and a bottom surface in a substrate, forming a gate insulator on the bottom surface, forming a gate electrode on the gate insulator, forming a first insulative spacer adjacent to the first sidewall, a second insulative spacer adjacent to the gate electrode and second sidewall, and a third insulative spacer adjacent to the gate electrode such that a contact portion of the bottom surface between the first and third insulative spacers is exposed, forming a source and drain in the substrate and adjacent to the bottom surface, and forming source and drain contacts such that the source contact is in the trench and electrically coupled to the source at the contact portion of the bottom surface, and the drain contact is electrically coupled to the drain at the top surface of the substrate.

Preferably, the source and drain include sidewall source and drain regions implanted through the top surface and adjacent to the sidewalls, and localized source and drain regions implanted through the bottom surface and adjacent to the bottom surface. It is also preferred that the localized drain region is lightly doped, and the localized source region and the sidewall source and drain regions are heavily doped, to provide an LDD structure with reduced parasitic resistance. The localized source and drain regions can define channel junctions that are substantially aligned with the bottom surface of the gate electrode. The gate electrode can be formed by forming disposable spacers in the trench, depositing a blanket layer of gate electrode material over the substrate, polishing the gate electrode material until it is substantially aligned with a top surface of the substrate, and removing the gate electrode material in a first lateral portion of the trench. Thereafter, the insulative spacers are formed, and the source contact is formed between the first and third insulative spacers. As exemplary materials, the gate electrode is polysilicon, the gate insulator is silicon dioxide, the disposable spacers are silicon dioxide, and the insulative spacers are silicon nitride.

A first embodiment of the method includes providing a P-type substrate, implanting an N+ doped layer into the substrate, patterning a first photoresist layer over the substrate, etching a trench defined by an opening in the first photoresist layer completely through the doped layer and partially through the substrate thereby splitting the doped layer into N+ sidewall source and drain regions, stripping the first photoresist layer, forming oxide spacers on first and second sidewalls of the trench, growing an oxide layer on a central portion of the bottom surface of the trench between the oxide spacers, depositing a polysilicon layer over the substrate, polishing the polysilicon layer until it is substantially aligned with the top surface of the substrate, removing the oxide spacers to form voids in the trench, implanting an N– localized drain region through one of the voids, patterning a second photoresist layer over the substrate, etching the polysilicon layer and oxide layer in a first lateral portion of the trench defined by an opening in the second photoresist layer to form a polysilicon gate electrode on a gate oxide in a second lateral portion of the trench, implanting an N+ localized source region into the first lateral portion of the trench, stripping the second photoresist layer, forming a first nitride spacer adjacent to the first sidewall, a second nitride spacer adjacent to the polysilicon gate electrode and second sidewall, and a third nitride spacer adjacent to the polysilicon gate electrode such that a contact portion of the bottom surface between the first and third nitride spacers is exposed, forming a silicide on the contact portion of the bottom surface, applying a high-temperature anneal to form the source and drain by activating and merging the localized and sidewall source and drain regions, forming an oxide layer over the substrate with a contact window over the silicide, and depositing a metal into the contact window such that the source contact includes the silicide and the metal.

A second embodiment of the method includes providing a P-type substrate, patterning a first photoresist layer over the substrate, etching a trench defined by an opening in the first photoresist layer partially through the substrate, stripping the first photoresist layer, forming oxide spacers on first and second sidewalls of the trench, growing an oxide layer on a central portion of the bottom surface of the trench between the oxide spacers, depositing a polysilicon layer over the substrate, polishing the polysilicon layer until it is substantially aligned with the top surface of the substrate, partially removing the oxide spacers to form voids in the trench, simultaneously implanting N+ sidewall source and drain regions outside the trench and an N– localized drain region through one of the voids, etching the polysilicon layer and the oxide layer in a first lateral portion of the trench defined by an opening in the second photoresist layer to form a polysilicon gate electrode on a gate oxide in a second lateral portion of the trench, implanting an N+ localized source region into the first lateral portion of the trench, stripping the second photoresist layer and the remaining portions of the oxide spacers, forming a first nitride spacer adjacent to the first sidewall, a second nitride spacer adjacent to the polysilicon gate electrode and second sidewall, and a third nitride spacer adjacent to the polysilicon gate electrode such that a contact portion of the bottom surface between the first and third nitride spacers is exposed, forming a silicide on the contact portion of the bottom surface, applying a high-temperature anneal to form the source and drain by activating and merging the localized and sidewall source and drain regions, forming an oxide layer over the substrate with a contact window over the silicide, and depositing a metal into the contact window such that the source contact includes the silicide and the metal.

A primary advantage of the invention is that the IGFET can have a channel length that is significantly smaller than the minimum resolution of the available lithographic system, thereby providing a next generation transistor with the present generation lithography. In addition, the gate electrode is substantially aligned with the top surface of the substrate, and the source contact overlaps the trench.

These and other aspects, features and advantages of the invention will be further described and more readily apparent from a review of the detailed description of the preferred embodiments which follow.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 1A:
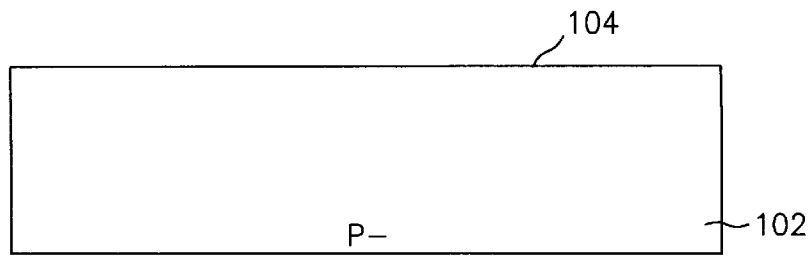
FIGS. 1A–1T show cross-sectional views of successive process steps for forming an IGFET with a gate electrode and source contact in a trench in accordance with a first embodiment of the invention.

In the drawings, depicted elements are not necessarily drawn to scale and like or similar elements may be designated by the same reference numeral throughout the several views.

FIGS. 1A–1T show cross-sectional views of successive process steps for forming an IGFET with a gate electrode and a source contact in a trench in accordance with a first embodiment of the invention.

In FIG. 1A, semiconductor substrate 102 suitable for integrated circuit manufacture is provided. Substrate 102 includes a P– epitaxial surface layer with a <100> orientation, a boron concentration of $1 \times 10^{15}$ atoms/cm$^3$ and a resistivity of 12 ohm-cm. Preferably, the epitaxial surface layer is disposed on a P+ base layer (not shown). The epitaxial surface layer has a planar top surface 104.

Figure 1B:
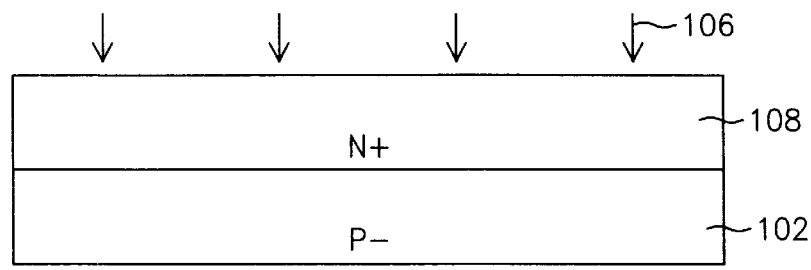

In FIG. 1B, substrate 102 is subjected to ion implantation of arsenic, indicated by arrows 106, at a heavy dosage in the range of $1 \times 10^{15}$ to $5 \times 10^{15}$ atoms/cm$^2$ and an energy in the range of 2 to 80 kiloelectron-volts. This forms N+ doped layer 108 with an arsenic concentration in the range of $1 \times 10^{20}$ to $1 \times 10^{21}$ atoms/cm$^3$ and a depth of 1800 angstroms beneath top surface 104.

Figure 1C:
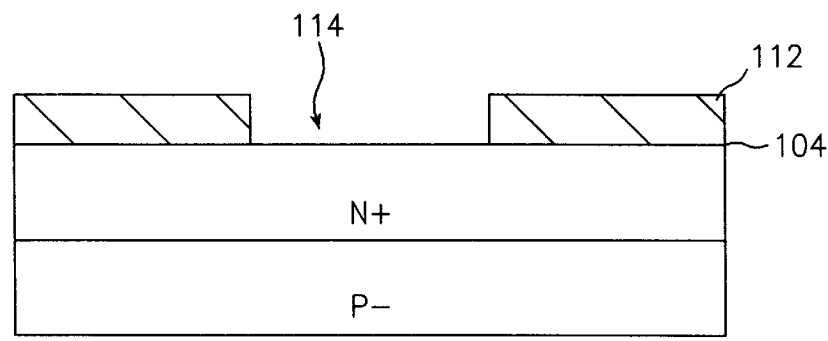

In FIG. 1C, photoresist layer 112 is deposited as a continuous layer on top surface 104 and then selectively irradiated using a photolithographic system, such as a step and repeat optical projection system, in which I-line ultraviolet light from a mercury-vapor lamp is projected through a reticle and a focusing lens to project the desired image pattern on photoresist layer 112. Thereafter, photoresist layer 112 is developed and the irradiated portions are removed to provide opening 114 that defines the lateral boundaries for a trench. The minimum resolution (i.e. linewidth and spacing) of the step and repeat system is 4000 angstroms (0.4 microns). Therefore, to reduce feature sizes, the length of opening 114 is 4000 angstroms.

Figure 1D:
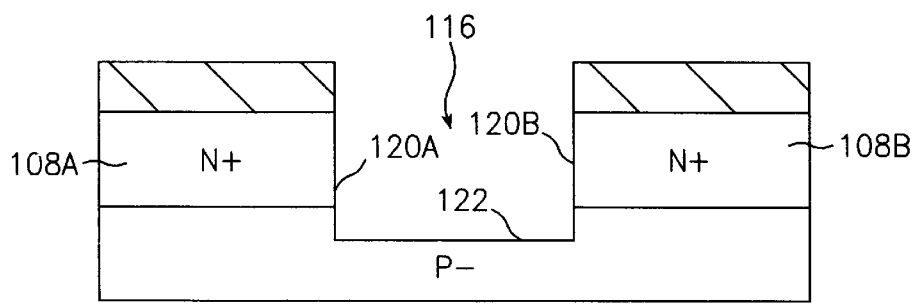

In FIG. 1D, an anisotropic etch provided by a reactive ion etch is applied using photoresist layer 112 as an etch mask. The etch forms trench 116 completely through doped layer 108 and partially through substrate 102. Trench 116 includes opposing vertical sidewalls 120A and 120B, and planar bottom surface 122. Trench 116 has a depth (or height) of 2000 angstroms between top surface 104 and bottom surface 122, and a length of 4000 angstroms between sidewalls 120A and 120B. Trench 116 extends 200 angstroms beneath doped layer 108 and splits doped layer 108 into sidewall source region 108A and sidewall drain region 108B. Sidewall source region 108A is adjacent to sidewall 120A, and sidewall source region 108B is adjacent to sidewall 120B, however sidewall source region 108A and sidewall drain region 108B are spaced from bottom surface 122.

Figure 1E:
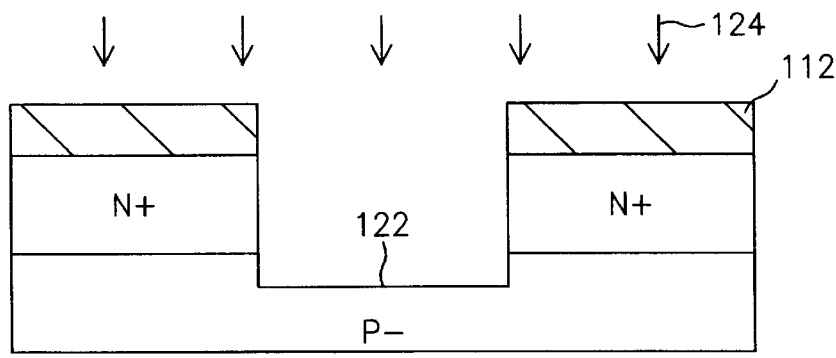

In FIG. 1E, a channel implant provided by boron, as indicated by arrows 124, is implanted through bottom surface 122 using photoresist layer 112 as an implant mask. The channel implant includes a well implant, then a punchthrough implant, and then a threshold voltage implant. The well implant provides a more uniform background doping, the punchthrough implant provides the channel with greater robustness to punchthrough voltages, and the threshold voltage implant sets the threshold voltage of the IGFET to approximately 0.4 to 0.7 volts. The well implant is provided by boron at a dose in the range of $1 \times 10^{12}$ to $1 \times 10^{13}$ atoms/cm$^2$ and an energy in the range of 100 to 170 kiloelectron-volts, the punchthrough implant is provided by boron at a dose in the range of $1 \times 10^{12}$ to $1 \times 10^{13}$ atoms/cm$^2$ and an energy in the range of 40 to 100 kiloelectron-volts, and the threshold voltage implant is provided by boron at a dose in the range of $1 \times 10^{12}$ to $1 \times 10^{13}$ atoms/cm$^2$ and an energy in the range of 2 to 30 kiloelectron-volts. The channel implant has a boron concentration on the order of $1 \times 10^{17}$ atoms/cm$^3$ and provides suitable doping for a channel adjacent to bottom surface 122.

Figure 1F:
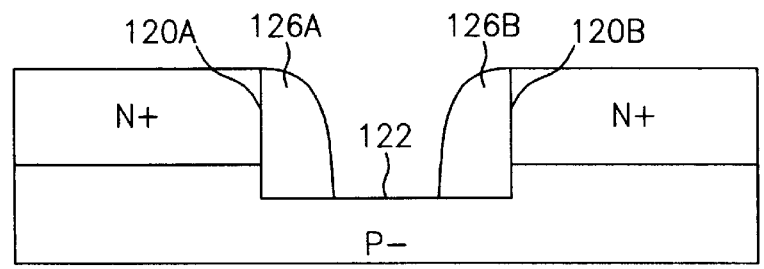

In FIG. 1F, photoresist layer 112 is stripped, a blanket layer of silicon dioxide that is 2500 angstroms thick is conformally deposited over substrate 102, and then an anisotropic etch provided by a reactive ion etch is applied to form oxide spacers 126A and 126B in trench 116. Oxide spacers 126A and 126B contact and completely cover sidewalls 120A and 120B, respectively, and extend to top surface 104. Oxide spacers 126A and 126B also contact and cover outer portions of bottom surface 122 adjacent to sidewalls 120A and 120B, but leave exposed a central portion of bottom surface 122 between and adjacent to the outer portions. Oxide spacers 126A and 126B each have a length of 800 angstroms along the outer portions of bottom surface 122. Therefore, the central portion of bottom surface 122 has a length of 2400 angstroms (4000–1600 angstroms), and is spaced from sidewalls 120A and 120B by 800 angstroms.

Figure 1G:
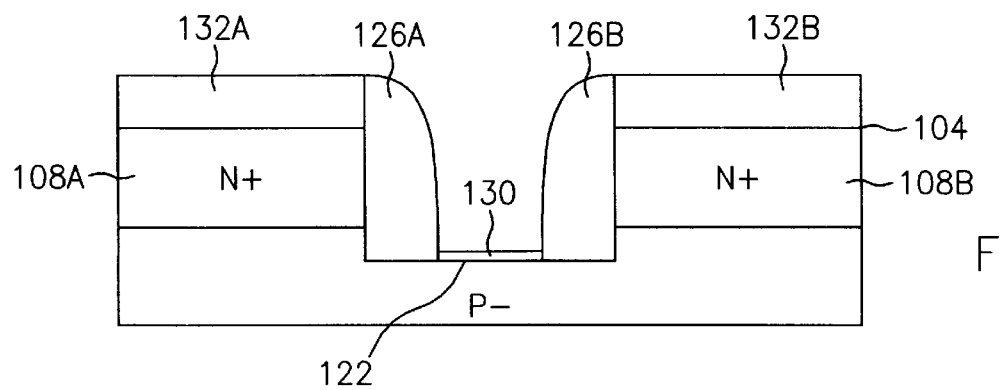

In FIG. 1G, a high quality layer of silicon dioxide is thermally grown on the exposed silicon surfaces using tube growth at a temperature of 700° to 1000° C. in an O$_2$ containing ambient. As a result, oxide layer 130 with a thickness of 50 angstroms is formed on the central portion of bottom surface 122, oxide segments 132A and 132B are formed with a substantially greater thickness on top surface 104, and the heights oxide spacers 126A and 126B increase. Oxide segments 132A and 132B are thicker than oxide layer 130 due to the heavy doping of arsenic in sidewall source and drain regions 108A and 108B.

Figure 1H:
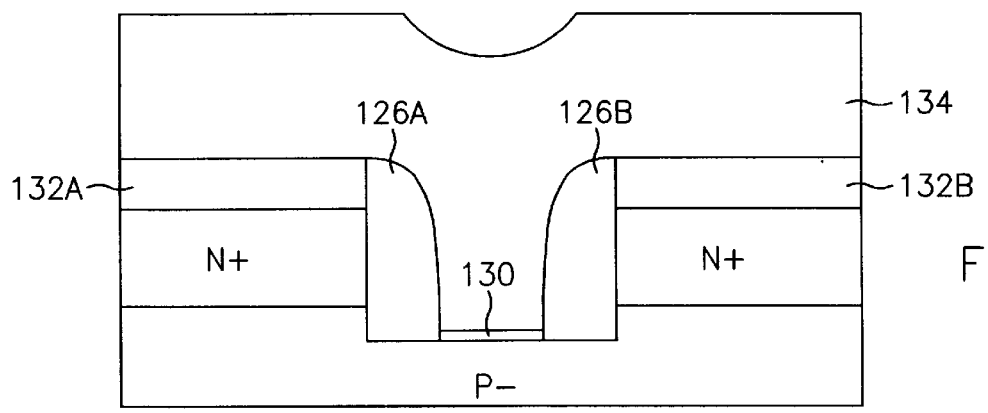

In FIG. 1H, a blanket layer of undoped polysilicon 134 with a thickness of 4000 angstroms is deposited by low pressure chemical vapor deposition over substrate 102. Thus, polysilicon 134 is deposited on oxide spacers 126A and 126B, on gate oxide 130, and on oxide segments 132A and 132B. Polysilicon 134 fills the remaining space in trench 116. Thereafter, polysilicon 134 is doped by subjecting the structure to ion implantation of arsenic at a heavy dose in the range of $1 \times 10^{15}$ to $5 \times 10^{15}$ atoms/cm$^2$ and an energy in the range of 2 to 80 kiloelectron-volt Polysilicon 134 is thick enough to prevent the arsenic ions from passing through to the underlying structure.

Figure 1I:
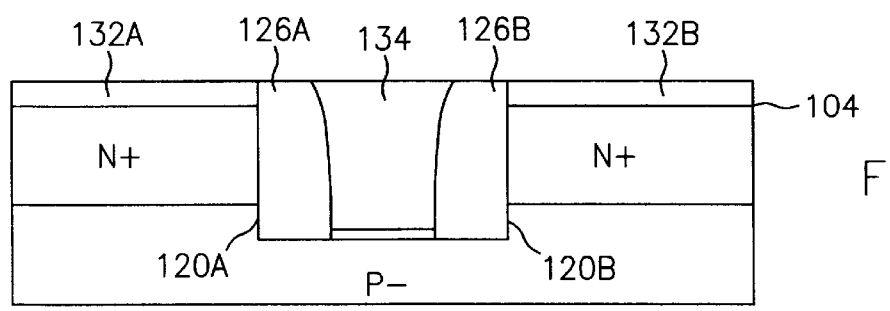

In FIG. 1I, the structure is planarized by applying chemical-mechanical polishing in the presence of an abrasive slurry that is highly selective of polysilicon with respect to silicon dioxide. The polishing grinds down polysilicon 134 along with oxide spacers 126A and 126B and oxide segments 132A and 132B, and is discontinued before reaching top surface 104 using oxide spacers 126A and 126B and oxide segments 132A and 132B as a stop-layer. After polishing occurs, the top surfaces of oxide spacers 126A and 126B, oxide segments 132A and 132B, and polysilicon 134 are aligned and form a planar surface 50 angstroms above top surface 104. Furthermore, polysilicon 134 does not overlap sidewalls 120A and 120B.

Figure 1J:
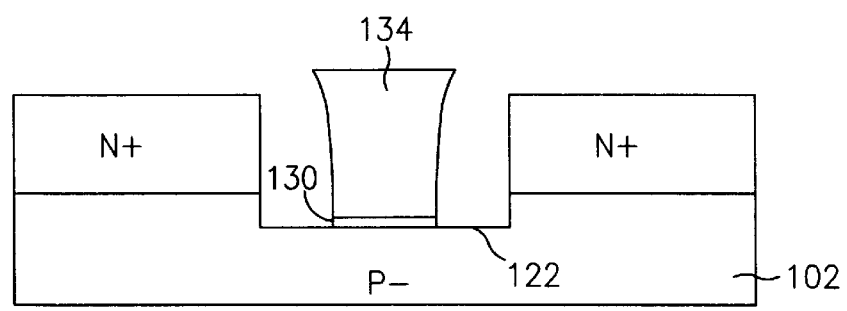

In FIG. 1J, a wet etch that is highly selective of silicon dioxide is applied to completely remove oxide spacers 126A and 126B and oxide segments 132A and 132B without attacking polysilicon gate electrode 134 or substrate 102. The wet etch also undercuts a slight amount of oxide layer 130 beneath the bottom surface of polysilicon 134. The removal of oxide spacers 126A and 126B creates voids in trench 116 that expose the outer portions of bottom surface 122.

Figure 1K:
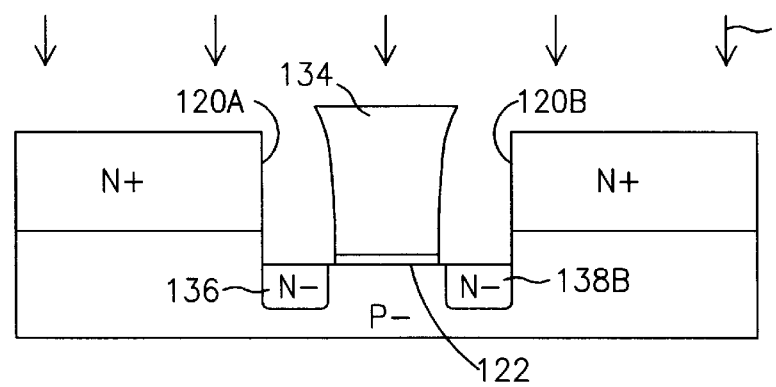

In FIG. 1K, substrate 102 is subjected to ion implantation of arsenic, indicated by arrows 138, at a light dosage in the range of $1 \times 10^{13}$ to $5 \times 10^{14}$ atoms/cm$^2$ and an energy in the range of 2 to 80 kiloelectron-volts. The implant has little effect on sidewall source region 108A and sidewall drain region 108B, which are already doped N+. Polysilicon 134 provides an implant mask for the central portion of bottom surface 122. However, the arsenic ions are implanted through the voids in trench 116 and directly through the exposed outer portions of bottom surface 122 outside polysilicon 134 to form localized region 136 and localized drain region 138B in substrate 102. Localized region 136 and localized drain region 138B are adjacent to the outer portions of bottom surface 122, extend to sidewalls 120A and 120B, respectively, and are slightly outside oxide layer 130. Localized region 136 and localized drain region 138B are doped N- with an arsenic concentration in the range of $5 \times 10^{17}$ to $5 \times 10^{18}$ atoms/cm$^3$ and a depth of 1000 angstroms beneath bottom surface 122. Localized region 136 shall have little effect on a heavily doped localized source region to be subsequently implanted, as described below.

Figure 1L:
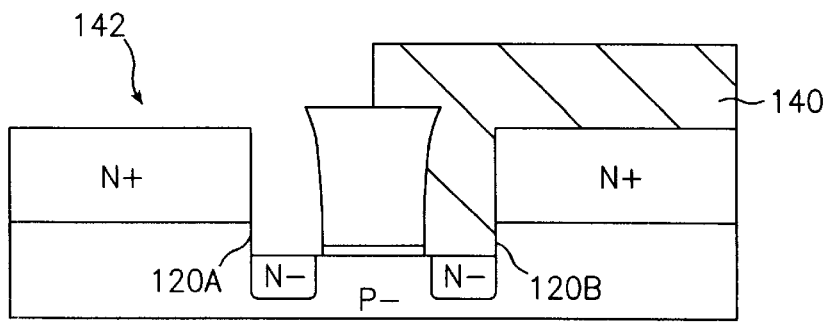

In FIG. 1L, photoresist layer 140 is deposited as a continuous layer over substrate 102 and then selectively irradiated using the step and repeat system. Thereafter, photoresist layer 140 is developed and the irradiated portions are removed to provide opening 142 that exposes a first lateral portion of trench 116 while photoresist layer 140 covers a second lateral portion of trench 116. The first lateral portion includes sidewall 120A and has a length of 2000 angstroms, and the second lateral portion includes sidewall 120B and has a length of 2000 angstroms. Thus, the first and second lateral portions evenly divide trench 116.

Figure 1M:
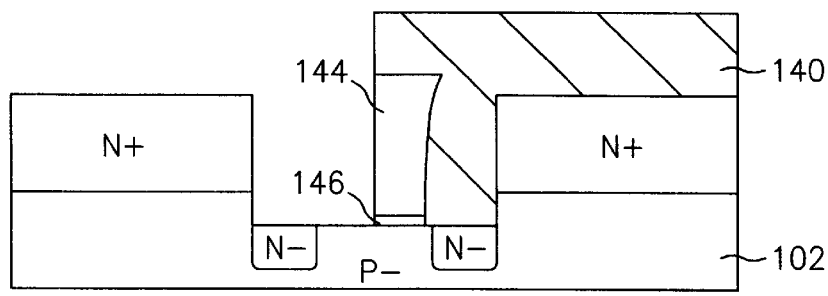

In FIG. 1M, an anisotropic etch provided by a reactive ion etch is applied using photoresist layer 140 as an etch mask. The etch removes the portions of polysilicon 134 and oxide layer 130 in the first lateral portion of trench 116. The remaining portions, in the second lateral portion of trench 116, form polysilicon gate electrode 144 and gate oxide 146. Polysilicon gate electrode 144 extends merely 50 angstroms above top surface 104, and therefore is substantially aligned with top surface 104. Furthermore, substantially all of polysilicon gate electrode 144 is within trench 116, polysilicon gate electrode 144 does not overlap top surface 104, and polysilicon gate electrode 144 is spaced from and electrically isolated from substrate 102.

Figure 1N:
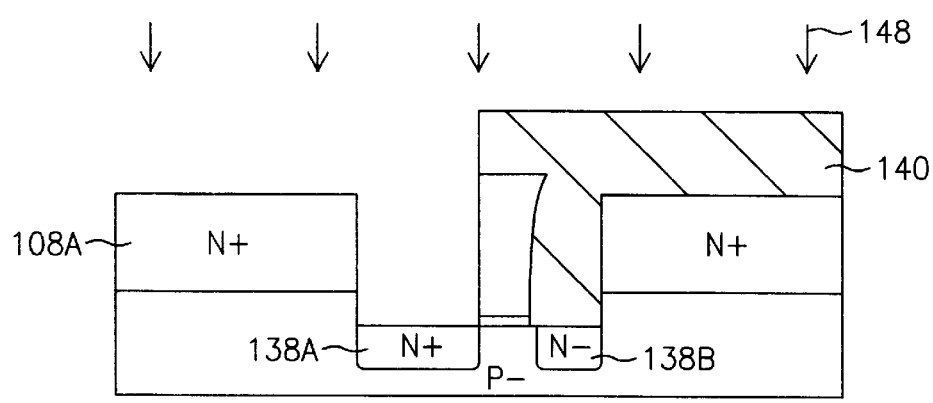

In FIG. 1N, the structure is subjected to ion implantation of arsenic, indicated by arrows 148, at a heavy dosage in the range of $1 \times 10^{15}$ to $5 \times 10^{15}$ atoms/cm$^2$ and an energy in the range of 2 to 80 kiloelectron-volts to provide localized source region 138A extending between sidewall 120A and polysilicon gate electrode 144 with an arsenic concentration in the range of $1 \times 10^{20}$ to $1 \times 10^{21}$ atoms/cm$^3$. Localized source region 138A is doped N+ and encompasses localized region 136. The implantation also increases the arsenic concentration of sidewall source region 108A. Moreover, photoresist layer 140 provides an implant mask for localized and sidewall drain regions 108B and 138B. Thus, localized drain region 138B remains lightly doped although localized source region 138A is heavily doped.

Figure 1O:
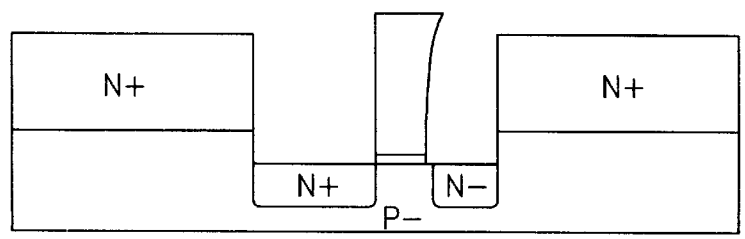

In FIG. 1O, photoresist layer 140 is stripped.

Figure 1P:
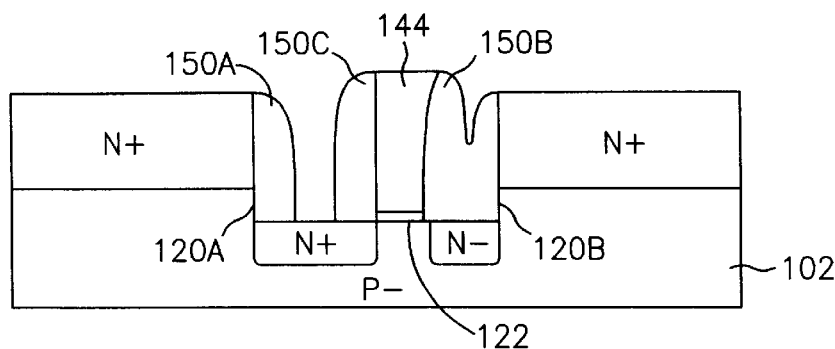

In FIG. 1P, a blanket layer of silicon nitride (Si$_3$N$_4$) that is 2500 angstroms thick is conformally deposited over substrate 102, and then an anisotropic etch provided by a reactive ion etch is applied to form nitride spacers 150A, 150A and 150C in trench 116. Nitride spacer 150A is adjacent to sidewall 120A, nitride spacer 150B is adjacent to polysilicon gate electrode 144 and sidewall 120B, and nitride spacer 150C is adjacent to polysilicon gate electrode 144 on the side opposite nitride spacer 150B. Nitride spacer 150B covers all of bottom surface 122 between polysilicon gate electrode 144 and sidewall 120B, however a contact portion of bottom surface 122 between nitride spacers 150A and 150C is exposed. Nitride spacers 150A and 150C each have a length of 500 angstroms along bottom surface 122. Therefore, the contact portion of bottom surface 122 has a length of 1000 angstroms (2000–1000 angstroms). It should be noted that since polysilicon gate electrode 144 is 800 angstroms from sidewall 120B along bottom surface 122, the reactive ion etch fails to split nitride spacer 150B into separate nitride spacers, although nitride spacer 150B includes a deep recess.

Figure 1Q:
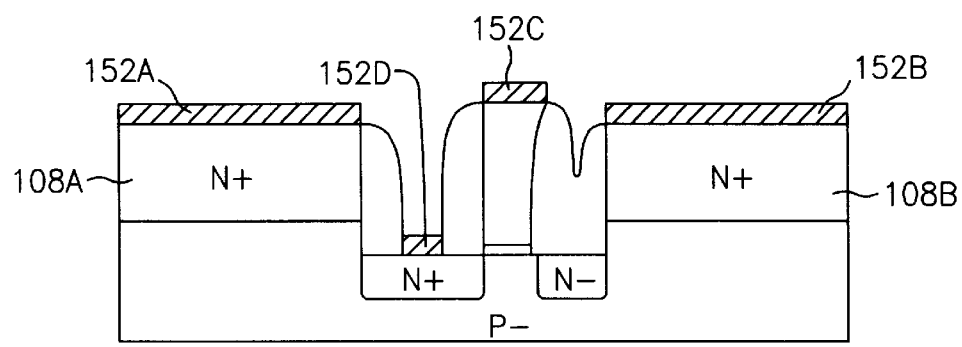

In FIG. 1Q, a thin layer of titanium is deposited over the structure, a rapid thermal anneal on the order of 700° C. for 30 seconds in a nitrogen ambient is applied to form titanium silicide on the silicon and polysilicon and form titanium nitride elsewhere, and a wet chemical etch is applied to remove the titanium nitride. As a result, titanium silicides 152A, 152B, 152C and 152D are formed on sidewall source and drain regions 108A and 108B, polysilicon gate electrode 144, and the contact portion of bottom surface 122, respectively.

Figure 1R:
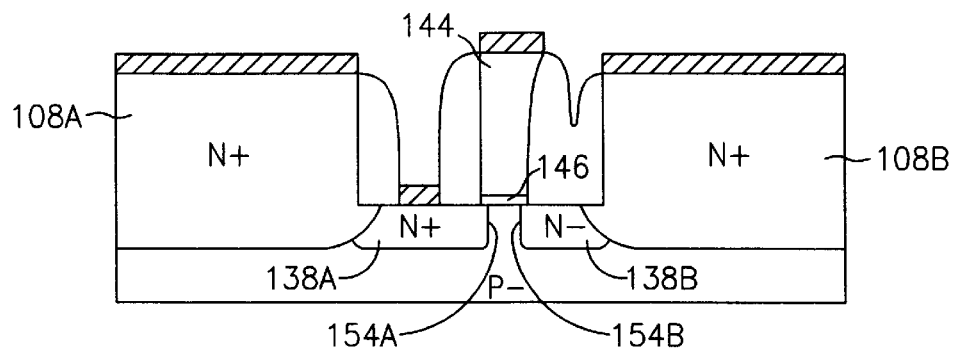

In FIG. 1R, a rapid thermal anneal on the order of 800° to 950° C. for 10 to 30 seconds is applied to remove crystalline damage and to activate and drive-in the implanted dopants. The implanted arsenic diffuses into substrate 102 both laterally and vertically. In particular, sidewall source region 108A and sidewall drain region 108B diffuse slightly beneath bottom surface 122. As a result, source regions 108A and 138A merge to form a source, and drain regions 108B and 138B merge to form a drain. Accordingly, localized drain region 138B provides for a lightly doped drain. Furthermore, localized source region 108A and localized drain region 108B laterally diffuse to provide channel junctions 154A and 154B, respectively, which define a channel that is substantially aligned with and adjacent to gate oxide 146, and substantially aligned with and spaced from the bottom surface of polysilicon gate electrode 144. The channel has a length of approximately 1200 angstroms. Accordingly, polysilicon gate electrode 144 controls an N-channel MOSFET.

Figure 1S:
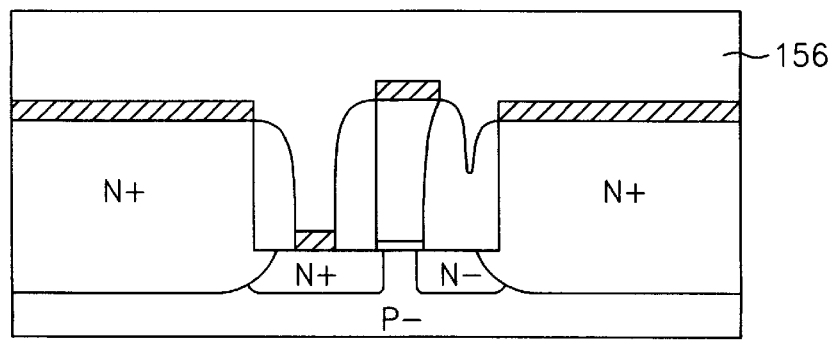

In FIG. 1S, oxide layer 156, with a thickness on the order of 6000 to 20,000 angstroms is deposited by chemical vapor deposition over the structure.

In FIG. 1T, contact windows are formed in oxide layer 156, and conductive metal is deposited into the contact windows to form source and drain contacts. For instance, the contact windows are formed by patterning a photoresist layer (not shown) over oxide layer 156 and then applying an anisotropic etch through openings in the photoresist layer to expose titanium silicides 150A, 150B, 150C and 150D. (The contact window exposing titanium silicide 150C is not shown.) Preferably, the etch is highly selective of silicon dioxide with respect to silicon nitride so that only a negligible amount of the nitride spacers is removed. Thereafter, a thin titanium nitride adhesion layer (not shown) is formed on the titanium silicides, and a layer of tungsten is deposited over the structure and polished to provide tungsten 160A over titanium silicides 150A and 150D, and tungsten 160B over titanium silicide 150B. As a result, a source contact that includes tungsten 160A and titanium silicides 150A and 150D is electrically coupled to localized source region 138A at bottom surface 122 and to sidewall source region 108A at top surface 104, and a drain contact that includes tungsten 160B and titanium silicide 150B is electrically coupled to drain region 108B at top surface 104 but is spaced from bottom surface 122. Advantageously, the source contact overlaps trench 116, thereby increasing packing density.

Figure 2A:
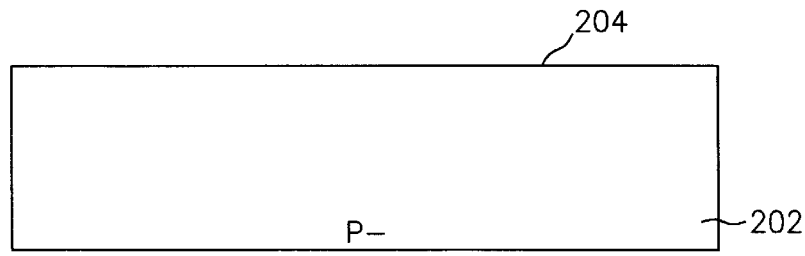
FIGS. 2A–2T show cross-sectional views of successive process steps for forming an IGFET with a gate electrode and a source contact in a trench in accordance with a second embodiment of the invention.
Figure 2B:
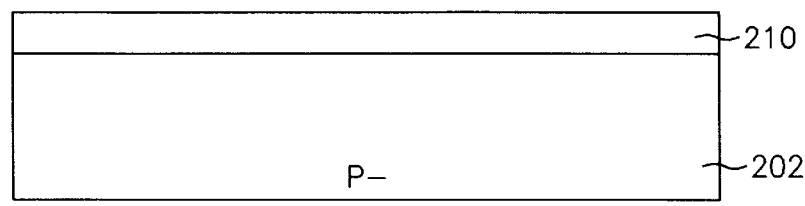
Figure 2C:
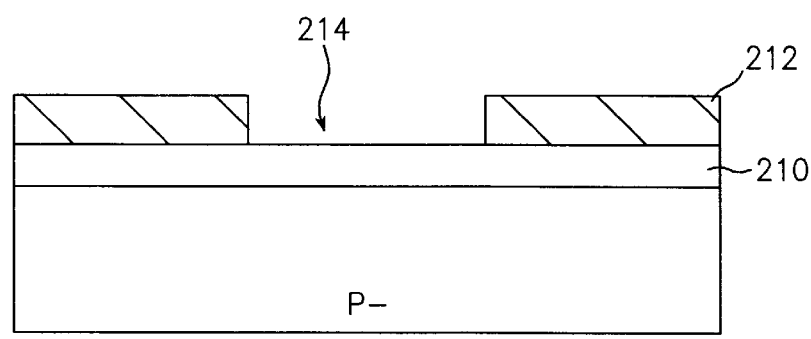
Figure 2D:
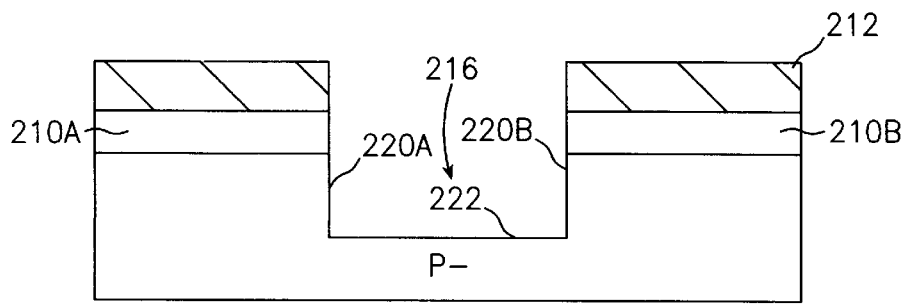
Figure 2E:
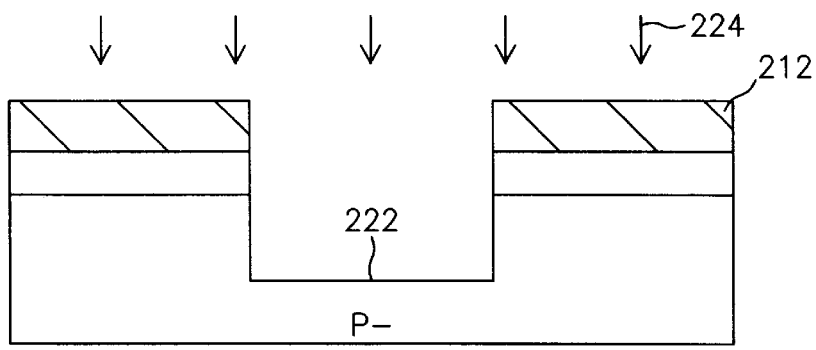
Figure 2F:
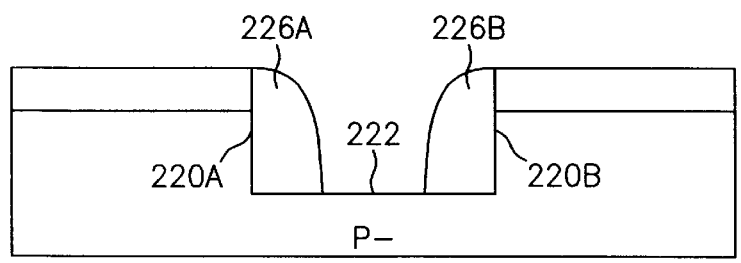
Figure 2G:
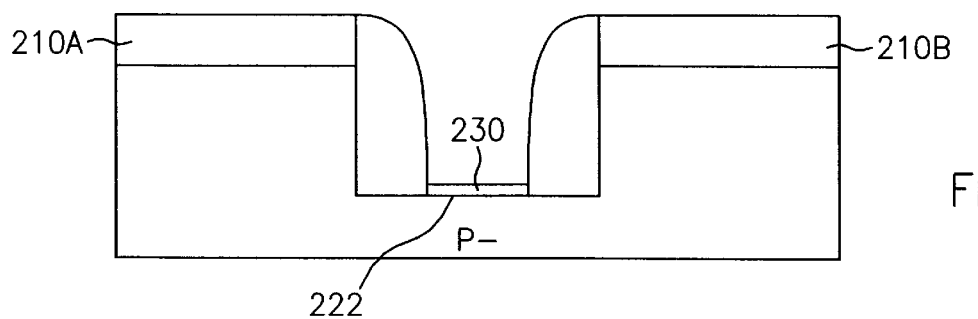
Figure 2H:
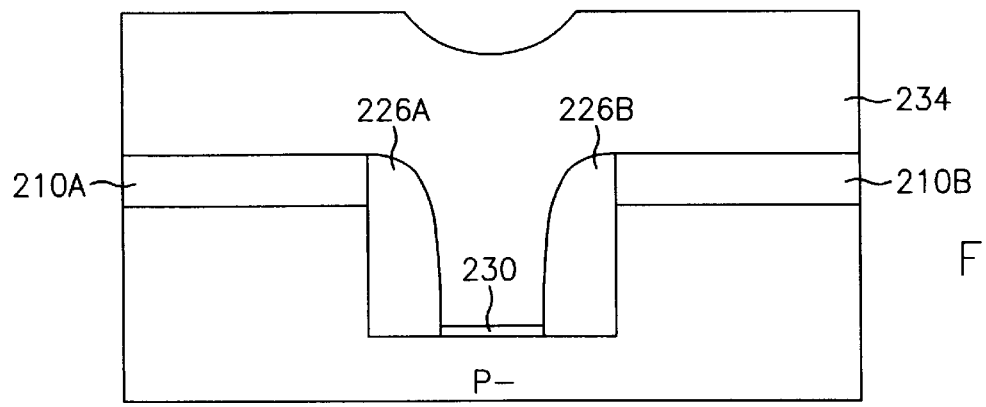
Figure 2I:
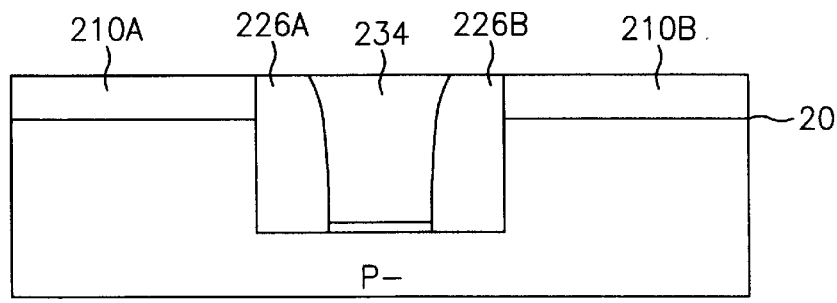
Figure 2J:
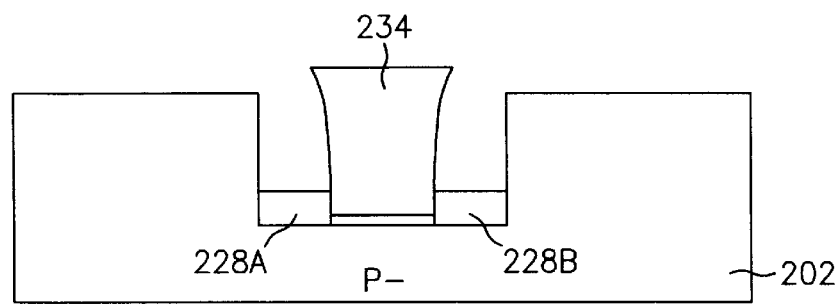
Figure 2K:
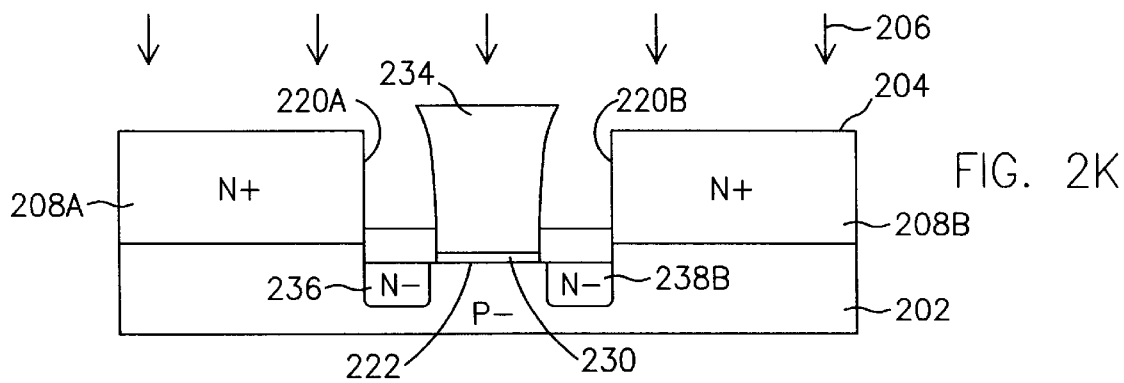
Figure 2L:
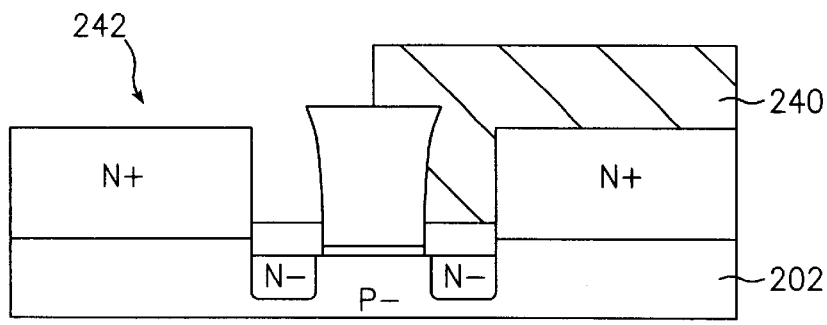
Figure 2M:
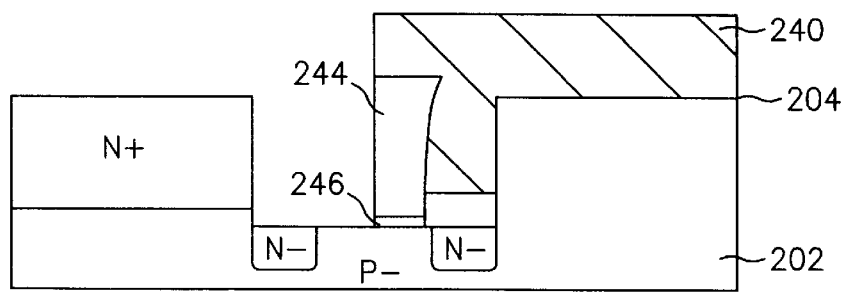
Figure 2N:
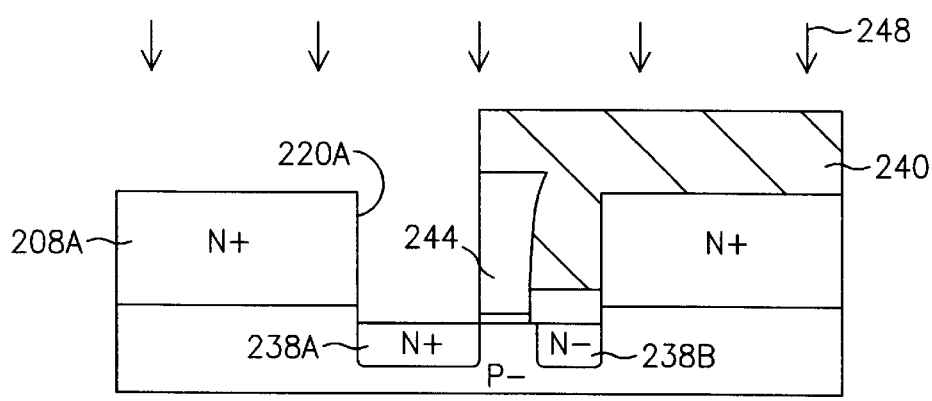
Figure 2O:
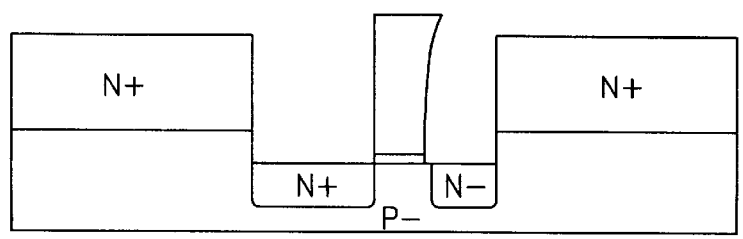
Figure 2P:
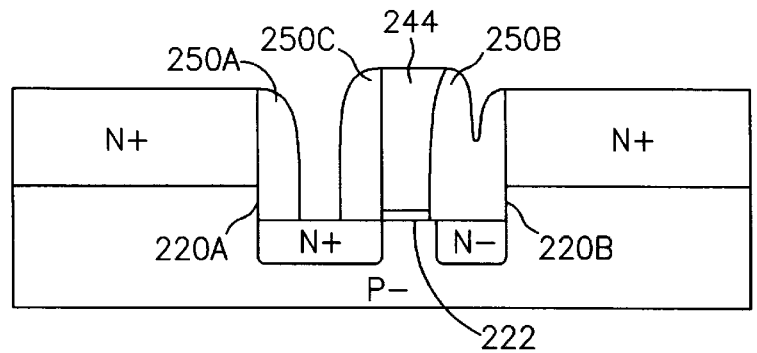
Figure 2Q:
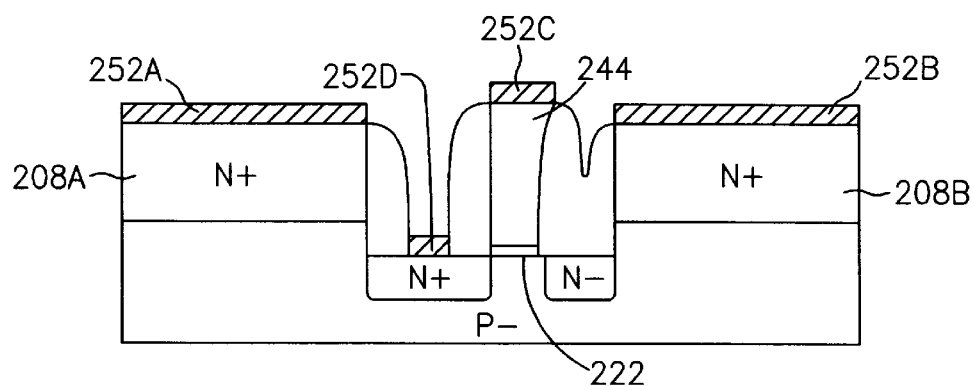
Figure 2R:
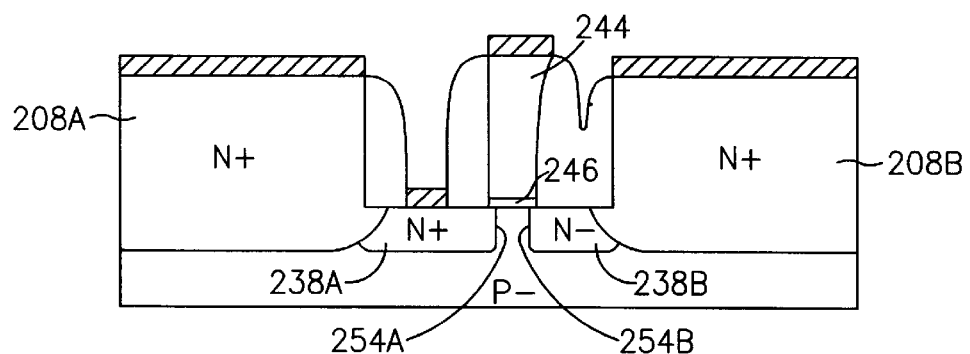
Figure 2S:
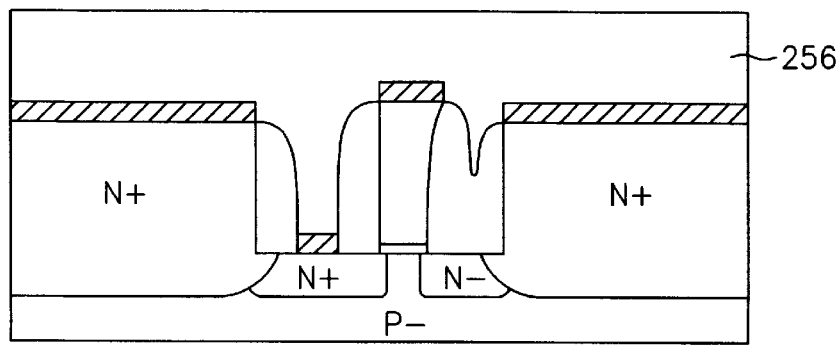
Figure 2T:
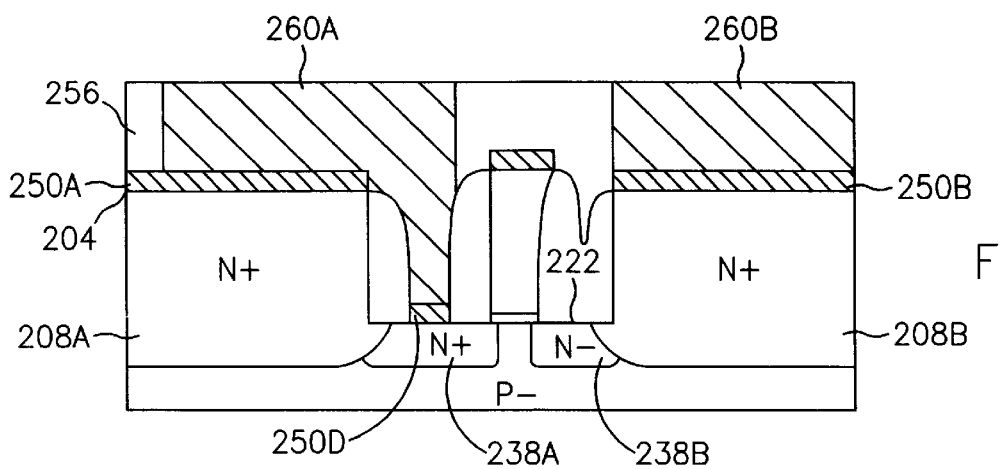

FIGS. 2A–2T show cross-sectional views of successive process steps for forming an IGFET with a gate electrode and a source contact in a trench in accordance with a second embodiment of the invention. In the first embodiment, four separate implant steps were used to dope the sidewall source and drain regions, the polysilicon gate electrode, the localized drain region, and the localized source region. Reducing the number of implant steps is desirable from an efficiency standpoint. The primary difference between the second embodiment and the first embodiment is that in the second embodiment, the localized drain region and the sidewall source and drain regions are implanted in single implant step, which also dopes the polysilicon. During this implant step, lower portions of the disposable spacers are left intact, and one of these lower portions blocks some but not all of the ions impinging thereon from reaching the localized drain region. Accordingly, by implanting with a heavy dose, the sidewall source and drain regions (being fully exposed) are heavily doped whereas the localized drain region (being partially masked) is lightly doped. A heavily doped localized source region is subsequently implanted. Unless otherwise noted, the elements for the second embodiment (e.g., substrate 202, gate oxide 246, etc.) are similar to elements of the first embodiment (e.g., substrate 102, gate oxide 146, etc.), and the description of related elements and process steps need not be repeated.

In FIG. 2A, semiconductor substrate 202 suitable for integrated circuit manufacture is provided. Substrate 202 includes a P− epitaxial surface layer with a boron concentration of $1\times10^{15}$ atoms/cm$^3$ and planar top surface 204.

In FIG. 2B, a blanket layer of silicon dioxide is deposited by chemical vapor deposition to form oxide layer 210 on substrate 202. Oxide layer 210 has a thickness of 200 angstroms.

In FIG. 2C, photoresist layer 212 is deposited as a continuous layer on oxide layer 210 and then selectively irradiated using a step and repeat system. Thereafter, photoresist layer 212 is developed and the irradiated portions are removed to provide opening 214 that defines the lateral boundaries for a trench.

In FIG. 2D, an anisotropic etch is applied using photoresist layer 212 as an etch mask. The trench etch completely removes the portion of oxide layer 210 exposed by opening 214 and forms trench 216 partially through substrate 202. Trench 216 includes opposing vertical sidewalls 220A and 220B, and planar bottom surface 222. Trench 216 splits oxide layer 210 into oxide segments 210A and 210B.

In FIG. 2E, a channel implant provided by boron, as indicated by arrows 224, is implanted through bottom surface 222 using photoresist layer 212 as an implant mask. The channel implant includes a well implant, then a punch-through implant, and then a threshold voltage implant. The channel implant has a boron concentration on the order of $1\times10^{17}$ atoms/cm$^3$ and provides suitable doping for a channel adjacent to bottom surface 222.

In FIG. 2F, photoresist layer 212 is stripped, a blanket layer of silicon dioxide is conformally deposited over substrate 202, and then an anisotropic etch is applied to form oxide spacers 226A and 226B adjacent to sidewalls 220A and 220B, respectively. Oxide spacers 226A and 226B cover outer portions of bottom surface 222 while exposing a central portion of bottom surface 222.

In FIG. 2G, oxide layer 230 with a thickness of 50 angstroms is thermally grown on the central portion of bottom surface 222. The thicknesses of oxide segments 210A and 210B also increase.

In FIG. 2H, a blanket layer of undoped polysilicon 234 is deposited by low pressure chemical vapor deposition over substrate 202. Polysilicon 234 contacts oxide segments 210A and 210B, oxide spacers 226A and 226B and oxide layer 230 and fills the remaining space in trench 216. Polysilicon 234 remains undoped prior to polishing.

In FIG. 2I, the structure is planarized by applying chemical-mechanical polishing in the presence of an abrasive slurry that is highly selective of polysilicon with respect to silicon dioxide. The polishing grinds down regions of polysilicon 234, oxide spacers 226A and 226B and oxide segments 210A and 210B but is discontinued before reaching top surface 204. After polishing occurs, polysilicon 234 does not overlap sidewalls 220A and 220B.

In FIG. 2J, a wet etch that is highly selective of silicon dioxide is applied to partially remove oxide spacers 226A and 226B without attacking polysilicon 234 or substrate 202. The wet etch removes oxide segments 210A and 210B. The wet etch also removes upper portions of oxide spacers 226A and 226B, creating voids extending partially through trench 216, but leaves intact the lower 500 angstroms of oxide spacers 226A and 226B, shown as lower oxide spacer portions 228A and 228B, respectively. Preferably, the wet etch provides a precisely controlled oxide removal rate to accurately control the heights of lower oxide spacer portions 228A and 228B.

In FIG. 2K, substrate 202 is subjected to ion implantation of arsenic, indicated by arrows 206, at a heavy dosage in the range of $1\times10^{15}$ to $5\times10^{15}$ atoms/cm$^2$ and an energy in the range of 2 to 80 kiloelectron-volts. The arsenic implant introduces sidewall source region 208A and sidewall drain region 208B into substrate 202, adjacent to top surface 204, adjacent to sidewalls 220A and 220B, respectively, and spaced from bottom surface 222. Sidewall source region 208A and sidewall drain region 208B are doped N+ with an arsenic concentration in the range of $1\times10^{20}$ to $1\times10^{21}$ atoms/cm$^3$ and a depth of 1800 angstroms beneath top surface 204. The arsenic implant also introduces localized region 236 and localized drain region 238B into substrate 202, adjacent to the outer portions of bottom surface 222, adjacent to sidewalls 220A and 220B, respectively, spaced from sidewall source and drain regions 208A and 208B, respectively, and spaced slightly from oxide layer 230. Localized source region 238A and localized drain region 238B are doped N− with an arsenic concentration in the range of $5\times10^{17}$ to $5\times10^{18}$ atoms/cm$^3$ and a depth of 1000 angstroms beneath bottom surface 222. During the implantation, polysilicon 234 provides an implant mask for the central portion of bottom surface 222, whereas, for arsenic ions passing through the voids in trench 216, lower spacer oxide portions 228A and 228B provide a partial implant mask for the outer portions of bottom surface 222. That is, lower spacer oxide portions 228A and 228B block a substantial amount of the arsenic ions impinging thereon from reaching substrate 202, but also allow a substantial amount of the arsenic ions impinging thereon to pass into substrate 202. In this manner, lower spacer oxide portions 228A and 228B control the doping concentration of localized region 236 and localized drain region 238B by permitting passage of some but not all of the arsenic ions impinging thereon into the underlying portions of substrate 202.

In FIG. 2L, photoresist layer 240 is deposited as a continuous layer over substrate 202 and then selectively irradiated using the step and repeat system. Thereafter, photoresist layer 240 is developed and the irradiated portions are removed to provide opening 242 that exposes a first lateral portion of trench 216 while photoresist layer 240 covers a second lateral portion of trench 216.

In FIG. 2M, an anisotropic etch provided by a reactive ion etch is applied using photoresist layer 240 as an etch mask.

The etch removes portions of polysilicon 234 and oxide layer 230 in the first lateral portion of trench 216, thereby forming polysilicon gate electrode 244 and gate oxide 246 in the second lateral portion. Polysilicon gate electrode 244 extends merely 50 angstroms above top surface 204, and therefore is substantially aligned with top surface 204. Furthermore, all of polysilicon gate 244 is within the length of trench 216, substantially all of polysilicon gate electrode 244 is within trench 216, and polysilicon gate electrode 244 is spaced from and electrically isolated from substrate 202.

In FIG. 2N, the structure is subjected to ion implantation of arsenic, indicated by arrows to 248, at a heavy dosage in the range of $1 \times 10^{15}$ to $5 \times 10^{15}$ atoms/cm$^2$ and an energy in the range of 2 to 80 kiloelectron-volts. This forms source region 238A extending between sidewall 220A and polysilicon gate electrode 244 with an arsenic concentration in the range of $1 \times 10^{20}$ to $1 \times 10^{21}$ atoms/cm$^3$. Localized source region 238A is doped N+ and encompasses localized region 236. The implantation also increases the heavy arsenic concentration of sidewall source region 208A. Moreover, photoresist layer 240 provides an implant mask for localized drain region 238B which remains lightly doped.

In FIG. 2O, photoresist layer 240 is stripped.

In FIG. 2P, a blanket layer of silicon nitride is conformally deposited over substrate 202, and then an anisotropic etch provided by a reactive ion etch is applied to form nitride spacers 250A, 250A and 250C in trench 216. Nitride spacer 250A is adjacent to sidewall 220A, nitride spacer 250B is adjacent to polysilicon gate electrode 244 and sidewall 220B, and nitride spacer 250C is adjacent to polysilicon gate electrode 244 on the side opposite nitride spacer 250B. Nitride spacer 250B covers all of bottom surface 222 between polysilicon gate electrode 244 and sidewall 220B, however a contact portion of bottom surface 222 between nitride spacers 250A and 250C is exposed.

In FIG. 2Q, a thin layer of titanium is deposited over the structure, a rapid thermal anneal is applied to form titanium silicide on the silicon and polysilicon and to form titanium nitride elsewhere, and a wet chemical etch is applied to remove the titanium nitride. As a result, titanium silicide contacts 252A, 252B, 252C and 252D are formed on sidewall source and drain regions 208A and 208B, polysilicon gate electrode 244, and the contact portion of bottom surface 222, respectively.

In FIG. 2R, a rapid thermal anneal on the order of 800° to 950° C. for 10 to 30 seconds is applied to remove crystalline damage and to activate and drive-in the implanted dopants. As a result, source regions 208A and 238A merge to form a source, and drain regions 208B and 238B merge to form a drain. Furthermore, localized source region 208A and localized drain region 208B provide channel junctions 254A and 254B, respectively, which define a channel that is substantially aligned with and adjacent to gate oxide 246, and substantially aligned with and spaced from the bottom surface of polysilicon gate electrode 244. Accordingly, polysilicon gate electrode 244 controls an N-channel MOSFET.

In FIG. 2S, oxide layer 256 is deposited by chemical vapor deposition over the structure.

In FIG. 2T, contact windows are formed in oxide layer 256, and conductive metal is deposited into the contact windows to form source and drain contacts. After the contact windows are formed, a thin titanium nitride adhesion layer (not shown) is deposited on the titanium silicides, and a layer of tungsten is deposited over the structure and polished to provide tungsten 260A over titanium silicides 250A and 250D, and tungsten 260B over titanium silicide 250B. As a result, a source contact that includes tungsten 260A and titanium silicides 250A and 250D is electrically coupled to localized source region 238A at bottom surface 222 and to sidewall source region 208A at top surface 204, and a drain contact that includes tungsten 260B and titanium silicide 250B is electrically coupled to drain region 208B at top surface 204 but is spaced from bottom surface 222. Advantageously, the source contact overlaps trench 216, thereby increasing packing density.

Further processing steps in the fabrication of IGFETs typically include forming appropriate interconnect metallization for the source, drain and gate electrode contacts, and then forming a passivation layer. In addition, either earlier or subsequent high-temperature process steps can be used to supplement or replace the high-temperature anneal to provide the desired anneal, activation, and diffusion for the implanted dopants. These further processing steps are conventional and need not be repeated herein. Likewise the principal processing steps disclosed herein may be combined with other steps readily apparent to those skilled in the art.

At completion of the process, it is preferred that the channel length be precisely controlled. However, to the extent that the lateral locations of the channel junctions are not (or can not be) precisely controlled, it is far preferable to have a slight overlap between the channel junctions and the bottom surface of the gate electrode as opposed to a lateral displacement or gap. While a slight overlap leads to capacitive effects (known as "Miller capacitance") that tend to reduce switching speeds, a lateral displacement or gap may prevent formation of a conductive channel between the source and the drain during operation. Furthermore, decreasing the channel length increases the drive current. Therefore, the overlap between the gate electrode and the source/drain involves a tradeoff between switching speed and drive current.

The present invention includes numerous variations to the embodiments described above. For instance, a heavily doped localized source region can be implanted into only the contact portion of the bottom surface using the gate electrode and the insulative spacers as an implant mask. Alternatively, the localized and sidewall source and drain regions can be implanted simultaneously using the gate electrode and lower portions of the disposable spacers as an implant mask. If desired, the localized source and drain regions can both be lightly doped or heavily doped. The drain contact can be electrically coupled to the drain at the bottom surface by exposing a second contact portion of the bottom surface between insulative spacers adjacent to the gate electrode and the second sidewall before forming the silicides, and forming an appropriate contact window in the thick oxide layer. The gate electrode can be various conductors such as aluminum, titanium, tungsten, cobalt, and combinations thereof, although the material may be limited by the use of subsequent high-temperature steps. The source and drain contacts can include various refractory metal silicides formed on the source and drain. The gate insulator and the spacers can be various dielectrics including oxides, nitrides and oxynitrides. The compositions and configurations of the disposable spacers can be adjusted to accommodate the desired dopant concentration in the localized source and drain regions, and the configurations of the insulative spacers can be adjusted to accommodate the desired location of the contact portion of the bottom surface. Suitable N-type dopants include arsenic and phosphorus; suitable P-type dopants include boron $B_{10}$, boron $B_{11}$, and $BF_x$ species such as $BF_2$.

Further details regarding trench transistors are disclosed in U.S. application Ser. No. 08/739,593 filed concurrently herewith, entitled "Trench Transistor With Metal Spacers" by Gardner et al.; U.S. application Ser. No. 08/739,595 filed concurrently herewith, entitled "Trench Transistor With Insulative Spacers" by Gardner et al.; U.S. application Ser. No. 08/739,592 filed concurrently herewith, entitled "Trench Transistor With Localized Source/Drain Regions Implanted Through Voids In Trench" by Gardner et al.; U.S. application Ser. No. 08/739,596 filed concurrently herewith, entitled "Trench Transistor With Localized Source/Drain Regions Implanted Through Selectively Grown Oxide Layer" by Gardner et al.; U.S. application Ser. No. 08/739,597 filed concurrently herewith, entitled "Trench Transistor In Combination With Trench Array" by Fulford, Jr. et al.; and U.S. application Ser. No. 08/739,566 filed concurrently herewith, entitled "Trench Transistor And Isolation Trench" by Gardner et al.; the disclosures of which are incorporated herein by reference.

The invention is particularly well-suited for fabricating N-channel MOSFETs, P-channel MOSFETs, and other types of IGFETs, particularly for high-performance microprocessors where high circuit density is essential. Although only a single IGFET has been shown for purposes of illustration, it is understood that in actual practice, many devices are fabricated on a single semiconductor wafer as widely practiced in the art. Accordingly, the invention is well-suited for use in an integrated circuit chip, as well as an electronic system including a microprocessor, a memory, and a system bus.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. A method of forming an IGFET, comprising the steps of:
   forming a trench in a substrate, wherein the trench includes first and second opposing sidewalls and a bottom surface;
   forming a gate insulator on the bottom surface;
   forming a gate electrode on the gate insulator;
   forming a first insulative spacer adjacent to the first sidewall, a second insulative spacer adjacent to the gate electrode and the second sidewall, and a third insulative spacer adjacent to the gate electrode, wherein a contact portion of the bottom surface between the first and third insulative spacers is exposed;
   forming a source and a drain in the substrate and adjacent to the bottom surface; and
   forming a source contact and a drain contact, wherein the source contact is in the trench and electrically coupled to the source at the contact portion of the bottom surface, and the drain contact is electrically coupled to the drain at a top surface of the substrate.

2. The method of claim 1, wherein forming the source and the drain includes: implanting localized source and drain regions through the bottom surface; implanting sidewall source and drain regions through the top surface; and
   applying a high-temperature anneal such that the localized and sidewall source regions merge to form the source, and the localized and sidewall drain regions merge to form the drain.

3. The method of claim 2, including implanting the sidewall source and drain regions and the localized drain region simultaneously.

4. The method of claim 2, including implanting the sidewall source and drain regions and the localized source and drain regions simultaneously.

5. The method of claim 2, including implanting the localized source region after implanting the localized drain region and the sidewall source and drain regions.

6. The method of claim 2, including implanting the sidewall source and drain regions before implanting the localized source and drain regions.

7. The method of claim 6, including implanting the sidewall source and drain regions before forming the trench, and implanting the localized source and drain regions after forming the trench.

8. The method of claim 7, including implanting the localized source region before forming the insulative spacers.

9. The method of claim 7, including implanting the localized source region after forming the insulative spacers.

10. The method of claim 7, including implanting the localized source and drain regions simultaneously.

11. The method of claim 7, including implanting the localized source region after implanting the localized drain region.

12. The method of claim 2, wherein the localized source region and the sidewall source and drain regions are heavily doped regions, and the localized drain region is a lightly doped region.

13. The method of claim 1, wherein forming the gate insulator and the gate electrode includes:
    forming a first disposable spacer adjacent to the first sidewall and a second disposable spacer adjacent to the second sidewall;
    growing a gate insulator material on a central portion of the bottom surface between the disposable spacers;
    depositing a gate electrode material over the substrate and on the disposable spacers and the gate insulator material;
    polishing the gate electrode material until the gate electrode material is planarized and does not overlap the first and second sidewalls;
    forming a photoresist layer over the substrate after polishing the gate electrode material, wherein an opening in the photoresist layer is above a first lateral portion of the trench that includes the first sidewall and the contact portion of the bottom surface, and the photoresist layer covers a second lateral portion of the trench that includes the second sidewall;
    applying an etch through the opening in the photoresist layer to remove the gate electrode material in the first lateral portion, thereby forming the gate electrode in the second lateral portion; and
    applying an etch to remove the gate insulator material in the first lateral portion, thereby forming the gate insulator in the second lateral portion.

14. The method of claim 13, wherein the gate electrode is substantially aligned with the top surface, and substantially all of the gate electrode is within the trench.

15. The method of claim 13, wherein forming the source and the drain includes:
    implanting sidewall source and drain regions through the top surface, wherein the sidewall source and drain regions are adjacent to the first and second sidewalls, respectively, and spaced from the bottom surface;

implanting localized source and drain regions through the bottom surface; and applying a high-temperature anneal such that the localized and sidewall source regions merge to form the source, and the localized and sidewall drain regions merge to form the drain.

16. The method of claim 15, including:

implanting a doped layer into the substrate;

applying an etch to form the trench completely through the doped layer and partially through the substrate, wherein the trench splits the doped layer into the sidewall source and drain regions;

implanting the localized drain region between the gate electrode material and the second sidewall after polishing the gate electrode material and before forming the photoresist layer; and implanting the localized source region between the gate electrode and the first sidewall after forming the gate electrode.

17. The method of claim 16, including implanting the localized source region before forming the insulative spacers.

18. The method of claim 16, including implanting the localized source region after forming the insulative spacers.

19. The method of claim 16, including removing the disposable spacers before implanting the localized drain region.

20. The method of claim 16, including removing upper portions of the disposable spacers and leaving lower portions of the disposable spacers intact, then implanting the localized drain region, and then removing the lower portions of the disposable spacers.

21. The method of claim 1, wherein the source contact is electrically coupled to the source at the top surface, and the drain contact is spaced from the bottom surface.

22. The method of claim 21, wherein source contact includes a first silicide region in contact with the source at the contact portion of the bottom surface and a second silicide region in contact with the source at the top surface, and the drain contact includes a single silicide region in contact with the drain at the top surface.

23. The method of claim 1, wherein the source and the drain provide first and second channel junctions for a channel adjacent to the bottom surface of the trench, and a length of the channel is less than half of a length between the sidewalls.

24. The method of claim 23, wherein the first channel junction is between a heavily doped region of the source and the channel, and a second channel junction is between a lightly doped region of the drain and the channel.

25. The method of claim 1, wherein the gate electrode is polysilicon, the gate insulator is silicon dioxide, the insulative spacers are selected from the group consisting of silicon dioxide, silicon nitride and silicon oxynitride, and the source and drain contacts include titanium silicide regions in contact with the substrate.

26. The method of claim 1, wherein the IGFET is an N-channel MOSFET.

27. The method of claim 1, wherein the IGFET is a P-channel MOSFET.

28. A method of forming an IGFET in a trench, comprising the steps of:

providing a semiconductor substrate;

implanting a doped layer into the substrate; then forming a first photoresist layer with an opening over the substrate;

applying an anisotropic etch through the opening in the first photoresist layer to form a trench completely through the doped layer and partially through the substrate, wherein the trench has first and second opposing sidewalls and a bottom surface, and the trench splits the doped layer into sidewall source and drain regions, with the sidewall source region adjacent to the first sidewall and spaced from the bottom surface, and the sidewall drain region adjacent to the second sidewall and spaced from the bottom surface;

stripping the first photoresist layer; then forming disposable spacers on the sidewalls and on outer portions of the bottom surface adjacent to the sidewalls while exposing a central portion of the bottom surface between the outer portions;

growing an oxide layer on the central portion of the bottom surface;

depositing a polysilicon layer over the substrate and on the disposable spacers and the oxide layer;

polishing the polysilicon layer until the polysilicon layer is planarized and does not overlap the first and second sidewalls; then removing at least portions of the disposable spacers to form voids in the trench between the polysilicon layer and the sidewalls;

implanting a localized drain region through one of the voids and the bottom surface into the substrate using the polysilicon layer as an implant mask for the central portion of the bottom surface; then forming a second photoresist layer over the substrate, wherein the second photoresist layer includes an opening above a first lateral portion of the trench that includes the first sidewall, and the second photoresist layer covers a second lateral portion of the trench that includes the localized drain region and the second sidewall;

applying an anisotropic etch through the opening in the second photoresist layer to remove the polysilicon layer in the first lateral portion of the trench, thereby forming a polysilicon gate electrode in the second lateral portion of the trench, wherein the polysilicon gate electrode is spaced from and electrically isolated from the substrate, and the polysilicon gate electrode is substantially closer to the second sidewall than to the first sidewall; then removing the oxide layer in the first lateral portion of the trench, thereby forming a gate oxide beneath the polysilicon gate electrode in the second lateral portion of the trench;

implanting a localized source region through the first lateral portion of the trench and the bottom surface into the substrate, wherein the localized source region is outside the second lateral portion of the trench;

stripping the second photoresist layer;

forming first, second and third insulative spacers in the trench, wherein the first insulative spacer is adjacent to the first sidewall, the second insulative spacer is adjacent to the polysilicon gate electrode and the second sidewall, the third insulative spacer is adjacent to the polysilicon gate electrode on a side opposite the second insulative spacer, and a contact portion of the bottom surface between the first and third insulative spacers is exposed; then applying a high-temperature anneal to form a source and a drain in the substrate, wherein the source includes the localized source region merged with the sidewall source region, the drain includes the localized drain region merged with the sidewall drain region, and the localized source and drain regions define a channel in the substrate adjacent to the bottom surface;

forming an insulative layer with contact windows over the substrate; and forming metallic source and drain contacts that extend through the contact windows, wherein the source contact is substantially closer to the first sidewall than to the second sidewall and includes first and second silicide regions that are electrically coupled to the source at the contact portion of the bottom surface and the top surface, respectively, and the drain contact is substantially closer to the second sidewall than to the first sidewall and is spaced from the bottom surface and includes a single silicide region that is electrically coupled to the sidewall drain region at the top surface.

29. The method of claim 28, including implanting the localized source region after etching the polysilicon layer and before forming the insulative spacers.

30. The method of claim 28, including implanting the localized source region after forming the insulative spacers.

* * * * *